(12) United States Patent
Mohan

(10) Patent No.: US 10,135,394 B2
(45) Date of Patent: Nov. 20, 2018

(54) LOW VOLTAGE SUPPLY AMPLIFIER AND AMPLIFICATION METHOD

(71) Applicants: IMEC vzw, Leuven (BE); Katholieke Universiteit Leuven, Leuven (BE)

(72) Inventor: Rachit Mohan, Heverlee (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 652 days.

(21) Appl. No.: 14/552,259

(22) Filed: Nov. 24, 2014

(65) Prior Publication Data

US 2016/0149544 A1    May 26, 2016

(51) Int. Cl.
    *G06G 7/12*     (2006.01)
    *G06G 7/26*     (2006.01)
    *H03F 1/02*     (2006.01)
    *H03F 3/45*     (2006.01)

(52) U.S. Cl.
CPC ....... *H03F 1/0205* (2013.01); *H03F 3/45179* (2013.01); *H03F 3/45475* (2013.01); *H03F 2200/513* (2013.01); *H03F 2203/45138* (2013.01); *H03F 2203/45168* (2013.01)

(58) Field of Classification Search
CPC ............ H03F 2200/513; H03K 5/2481; H03K 5/2472
USPC ...................................... 327/560, 65, 55, 57
See application file for complete search history.

(56) References Cited

U.S. PATENT DOCUMENTS

| | | | | |
|---|---|---|---|---|
| 7,332,916 | B2 * | 2/2008 | Nagata ............... | G01R 31/2884 324/713 |
| 8,604,406 | B2 * | 12/2013 | Kim ..................... | G06F 3/03542 250/208.1 |
| 9,503,026 | B2 * | 11/2016 | Lam ...................... | H03F 1/0266 |

OTHER PUBLICATIONS

Mohan et al., "0.35 V Time-domain Based Instrumentation Amplifier," Electronics Letters, Oct. 9, 2014, vol. 50, No. 21, pp. 1511-1513.
Chatterjee et al., "0.5-V Analog Circuit Techniques and Their Application in OTA and Filter Design," IEEE Journal of Solid-State Circuits, Dec. 2005, vol. 40, No. 12, pp. 2373-2387.

* cited by examiner

*Primary Examiner* — Lincoln Donovan
*Assistant Examiner* — Diana J Cheng
(74) *Attorney, Agent, or Firm* — Knobbe Martens Olson & Bear LLP

(57) ABSTRACT

A high-gain, low power, electronic amplifier for amplification of a low magnitude voltage signal through a comparator-integrator amplification method for energy-aware applications is disclosed. The electronic amplifier comprises: a comparator arrangement with at least one comparator unit adapted to receive a first voltage signal to be amplified and a first feedback voltage signal, and to generate a first two-level voltage comparison signal; a integrator arrangement to receive the first two-level voltage comparison signal and generate a first amplifier output signal corresponding to an amplification of the voltage signal to be amplified; and a first feedback network to receive the first amplifier output signal and generate the first feedback voltage signal.

20 Claims, 8 Drawing Sheets

LOW VOLTAGE SUPPLY AMPLIFIER AND AMPLIFICATION METHOD

BACKGROUND

Technological Field

The description relates to the field of voltage amplifiers, and more particularly to voltage amplifiers operating at low voltage supply.

Description of the Related Technology

Integrated circuits, such as a system on a chip (SoC), have in recent years been subject to substantial decreases in scale of size. Due to such decrease in size, the power consumption per unit area of the analog designs has significantly increased. In energy-aware applications, such as wireless sensor nodes, such high power consumption levels can have a significant influence on the working lifetime of the circuit.

It is known that one method to reduce the power consumption of a circuit is to reduce the supply voltage. Consequently there has been identified a need for a high gain amplifier that can operate at a low voltage to alleviate this issue.

Typical amplifiers obtain a voltage gain by first converting the input voltage to a current, and back to the voltage via an impedance. High gain is obtained by arranging the transistors of such amplifier in a cascade structure to implement a large impedance. However, as the threshold voltage and saturation voltage do not scale down with the voltage supply, the voltage headroom becomes severely limited at a low voltage supply. Such limited voltage headroom restricts the DC gain available to such a voltage amplifier. Accordingly, this dramatically reduces the fidelity of the amplified signal, due to linearity, noise and gain accuracy issues.

In a paper by Shouri Chatterjee, Yannis Tsividis and Peter Kinget, "0.5-V Analog Circuit Techniques and Their Application in OTA and Filter Design," *IEEE Journal of Solid-State Ciruits*, pp. 2373-2387, Vol. 40, No. 12, December 2005, the use of cascading low-gain amplifiers to obtain a high gain with a low supply voltage is disclosed. Although a cascading technique such as this may offer an increase in DC gain at a low voltage over conventional amplifiers, this leads to a substantial increase in power.

SUMMARY OF CERTAIN INVENTIVE ASPECTS

There is proposed an electronic amplifier for amplification of a first voltage signal to be amplified comprising: a comparator arrangement having a first voltage supply and comprising a latched comparator unit having a sampling frequency, wherein said comparator arrangement is adapted to receive the first voltage signal to be amplified and a first feedback voltage signal, and to generate a first two-level voltage comparison signal; an integrating arrangement having a second voltage supply, wherein said integrating arrangement is adapted to receive the first two-level voltage comparison signal, and to generate a first amplifier output signal corresponding to an amplification of the first voltage signal to be amplified; and a first feedback network, wherein said first feedback network is adapted to receive the first amplifier output signal and to generate the first feedback voltage signal, wherein the first and second voltage supply levels are 0.7V or less.

The general operation of the amplifier may be understood by considering the principle of time-domain operation. The first voltage signal to be amplified is converted (e.g. via the comparator arrangement) into a time-domain signal, such as a pulse-width modulated signal. This time-domain signal is then converted back into the voltage domain, to produce a first amplifier output signal. Such an amplification method may also be called voltage-time-voltage conversion, or comparator-integrator amplification.

In other words the information contained in the voltage magnitude signal (e.g. first voltage signal to be amplified) is converted into a time information signal (e.g. first two-level voltage comparison signal). The time information signal is converted back to a voltage signal (e.g. amplifier output signal) using an integrating arrangement such as a charge pump.

Working in the time domain overcomes the difficulties of operating at a low voltage headroom, as the dynamic range of an amplifier output signal is not necessarily limited by a low voltage headroom. This is due to the dependency of the overall gain of the voltage-time-voltage conversion on the sampling frequency and the transition frequency (i.e. unity gain bandwidth) of the voltage-time conversion stage. Thus an amplifier under the proposed voltage-time-voltage conversion methodology does not face the challenges of traditional voltage operational amplifier design, and hence power consumption may be reduced without affecting accuracy.

In the electronic amplifiers embodied herein, the comparator arrangement utilizes a first latched comparator unit. Latched comparator units tend to not consume any static current and hence may be made to operate with low-power consumption.

The latched comparator unit in the comparator arrangement may comprise MOSFETs operating in the inversion regime.

Optionally the integrating arrangement of the electronic amplifier is a charge-pump integrator. A charge-pump integrator is a low power consumption design to integrate the time domain signal and thus convert said signal back into the voltage domain.

Optionally the sampling frequency of the latched comparator unit is no less than two orders of magnitude greater than the highest frequency of the first voltage signal to be amplified. To prevent aliasing and improve the accuracy of the amplifier the sampling frequency of the comparator arrangement must be much higher than the highest frequency of the first voltage signal to be amplified. Aliasing, or other unwanted effects, may be caused by slewing or quantization error of the comparator arrangement.

Optionally the maximum sampling frequency of the first latched comparator unit is no more than 15 MHz, particularly no more than 10 MHz. With a low voltage supply, a frequency higher than this may not be possible due to the potential for a decreased slew rate of comparator units.

The electronic amplifier may optionally further comprise a preamplifier to process the first voltage signal to be amplified prior to being received by the comparator arrangement. A preamplifier may increase the capacitive load of the comparator and hence lower the noise floor.

The electronic amplifier may further comprise at least one low-pass filter applied to the first amplifier output signal. This filter can be used to reduce or mitigate the effect of such noise effects as quantization noise which may cause residual high frequency spurs.

The comparator arrangement may further be adapted to generate a second two-level voltage comparison signal wherein said second two-level voltage comparison signal is an inversion of the first two-level voltage comparison signal; and the integrating arrangement is further adapted to receive the second two-level voltage comparison signal.

The electronic amplifier is optionally adapted for amplifying a complimentary pair of a first and second voltage signal, wherein: the comparator arrangement comprises at least one latched comparator unit having the same sampling frequency, wherein the comparator arrangement is further adapted to receive the second voltage signal to be amplified and a second feedback voltage signal, and to generate a second two-level voltage comparison signal; the integrating arrangement is further adapted to receive the second two-level voltage comparison signal and to generate a second amplifier output signal corresponding to an amplification of the second voltage signal to be amplified, such that the difference between the first and second amplifier output signals corresponds to an amplification of the difference between the first and second voltage signals to be amplified; and a second feedback network, wherein said second feedback network is adapted to receive the second amplifier output signal and to generate the second feedback voltage signal.

In this way, a first and second voltage signal may both be converted into a time-domain signal using a respective latched comparator unit. Both time-domain signals may thus be provided to the integrating arrangement and converted back into the voltage domain to produce a first and second amplifier output signal. The difference between the first and second amplifier output signals is thus an amplification of the difference between the first and second voltage signals to be amplified.

In one optional alternative, however, the first and second voltage signal are supplied to only a single comparator unit, wherein the first and second feedback voltage signal is supplied to the same node as the respective first and second voltage signal. Thus the difference of the first voltage signal and first feedback voltage signal may be compared to the difference of the second voltage signal and second feedback voltage signal.

The first and second voltage signals may comprise a complimentary pair of differential signals.

The use of differential signals may help to reduce noise, such as electromagnetic noise. The voltage-time-voltage amplifier methodology herein described may be applied to a differential amplifier, which may improve the accuracy of amplification with the same benefits as previously described.

The electronic amplifier, when adapted for amplifying a complimentary pair of a first and second voltage signal, may further comprise a complimentary pair of chopper circuits, wherein the first chopper circuit spans the complimentary pair of a first and second voltage signal and the second chopper circuit spans the first and second amplifier output signals.

The electronic amplifier, when adapted for amplifying a complimentary pair of a first and second voltage signal, optionally further comprises at least one low pass filter applied to at least one of the first and second amplifier output signals.

At least one pre-amplification stage may be applied to at least one of: the first feedback signal; the first voltage signal to be amplified; the second feedback signal, the second voltage to be amplified.

This preamplifier may be used to further reduce the potential noise or nonlinearity effects that may occur due to such causes as charge kick-back of the comparator arrangement. The preamplifier may be applied to the first and second voltage signals prior to the comparator arrangements operation. The preamplifier may also act as an anti-alias filter prior to the sampling at the comparator stage.

Another aspect of the description provides a method of amplifying a voltage signal to be amplified, the method comprising: comparing the voltage signal to be amplified with a first feedback voltage and thereby generating a first two-level voltage comparison signal; integrating the first two-level voltage comparison signal over time to generate a first amplifier output voltage signal, corresponding to an amplification of the voltage signal to be amplified; and applying a feedback gain factor to the first amplifier output signal to generate the first feedback voltage signal, wherein the maximum voltage level of any voltage signal is 0.7V. The step of comparing the voltage signal to be amplified may further comprise comparing a second voltage signal to be amplified with a second feedback voltage to generate a second two-level voltage comparison signal; the step of integrating the first two-level voltage comparison signal over time may further comprise integrating the second two-level voltage comparison signal, such that the integration operation corresponds to the difference between the first and second two-level voltage comparison signals; the step of integration may further comprise generating a second amplifier output voltage signal, such that the difference between the first and second amplifier output voltage signal corresponds to an amplification of the difference between the first and second voltage signals to be amplified; and applying a feedback gain factor may further comprise applying a feedback gain factor to the second amplifier output signal to generate the second feedback voltage.

This provides a differential implementation, which may for example be used in an instrumentation amplifier circuit.

The feedback gain factor applied to the first and second amplifier output signal may be the same.

BRIEF DESCRIPTION OF THE DRAWINGS

Examples will now be described in detail, with reference to the accompanying drawings, in which.

DETAILED DESCRIPTION

Proposed is an electronic amplifier for amplification of a voltage signal. There is proposed a concept of performing a voltage-time-voltage conversion using a comparator integration operation in order to perform this amplification.

Figure 1:
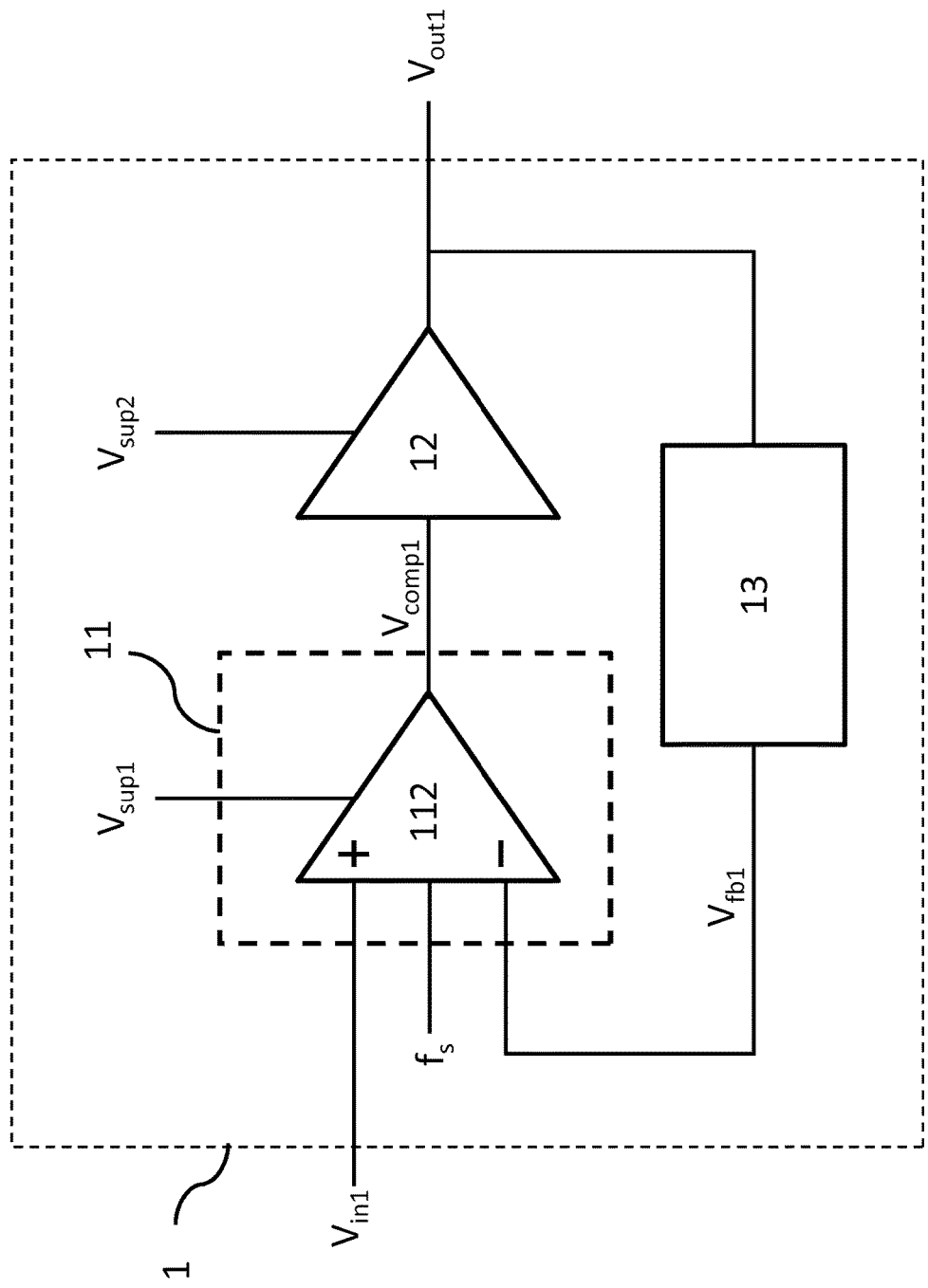
FIG. 1 illustrates an electronic amplifier according to a first embodiment.

Turning to FIG. 1, an exemplary embodiment of a non-inverting electronic amplifier 1 is shown. A first input voltage signal, also called a first voltage signal to be amplified, ($V_{in1}$) is received by a comparator arrangement 11 comprising at least a latched comparator unit 112. The comparator arrangement has a first supply voltage ($V_{sup1}$), which is no greater than 0.7V in order to provide a low supply voltage amplifier. The latched comparator unit compares the input signal to a first feedback voltage signal ($V_{fb1}$) at a sampling frequency ($f_s$). Based upon this comparison, the comparator arrangement generates a first two-level comparison voltage signal ($V_{comp1}$). The first level of the two-level comparison voltage signal may, for example, be generated if the first input voltage is greater than the feedback voltage signal (i.e. $V_{in1}>V_{fb1}$). The second level of the two-level comparison voltage signal may, for example, be similarly generated if the first input voltage is less than or equal to the feedback voltage signal (i.e. $V_{in1} \leq V_{fb1}$).

In an optional adaptation, the first level of the two-level voltage comparison signal is of a larger magnitude than the second level of the two-level voltage comparison signal. In an alternative embodiment, however, the second level of the two-level voltage comparison signal is of a larger magnitude than the first level of the two-level voltage comparison signal.

In other words, the two-level comparison voltage signal may have two states, high (e.g. at the supply voltage) or low (e.g. at a ground voltage). The state is toggled dependent upon the sign of the input difference (i.e. $V_{in1}-V_{fb1}$).

The two-level comparison voltage signal is received by an integrating arrangement 12 having a second supply voltage ($V_{sup2}$), which is also no greater than 0.7V. The integrating arrangement integrates the first two-level discrete voltage signal with respect to time, thereby generating a first amplifier output signal ($V_{out1}$) which is proportional to the first two-level discrete voltage signal integrated over time.

The first amplifier output signal is subsequently transmitted to a first feedback network 13. The feedback network applies a gain to the first amplifier output signal, thereby generating the first feedback voltage signal. Typically, although not always, the first feedback network carries out this gain operation by attenuating the first amplifier output voltage signal using, for example, two resistors arranged in a voltage divider configuration. Thus a first feedback voltage signal may also be referred to as an attenuated output signal.

Therefore in an optional embodiment, the gain applied to the amplifier signal may be fractional, such that the first feedback voltage signal is an attenuation of the first amplifier output voltage signal. In an alternative adaptation, the gain applied to the amplified signal may not be fractional, such that the first feedback voltage signal is an amplification of the first amplifier output voltage signal.

The electronic amplifier may alternatively be considered as operating in a similar manner to delta modulation. That is to say, in the present embodiment, the difference between an input value and an attenuated output value is periodically quantized by the comparator arrangement at a frequency $f_s$. The output of the integrating arrangement may rise or fall dependent upon whether the difference is positive or negative respectively.

The second supply voltage (i.e. the supply voltage of the integrating arrangement) is optionally the same as the first supply voltage (i.e. the supply voltage of the comparator arrangement).

Figure 2:
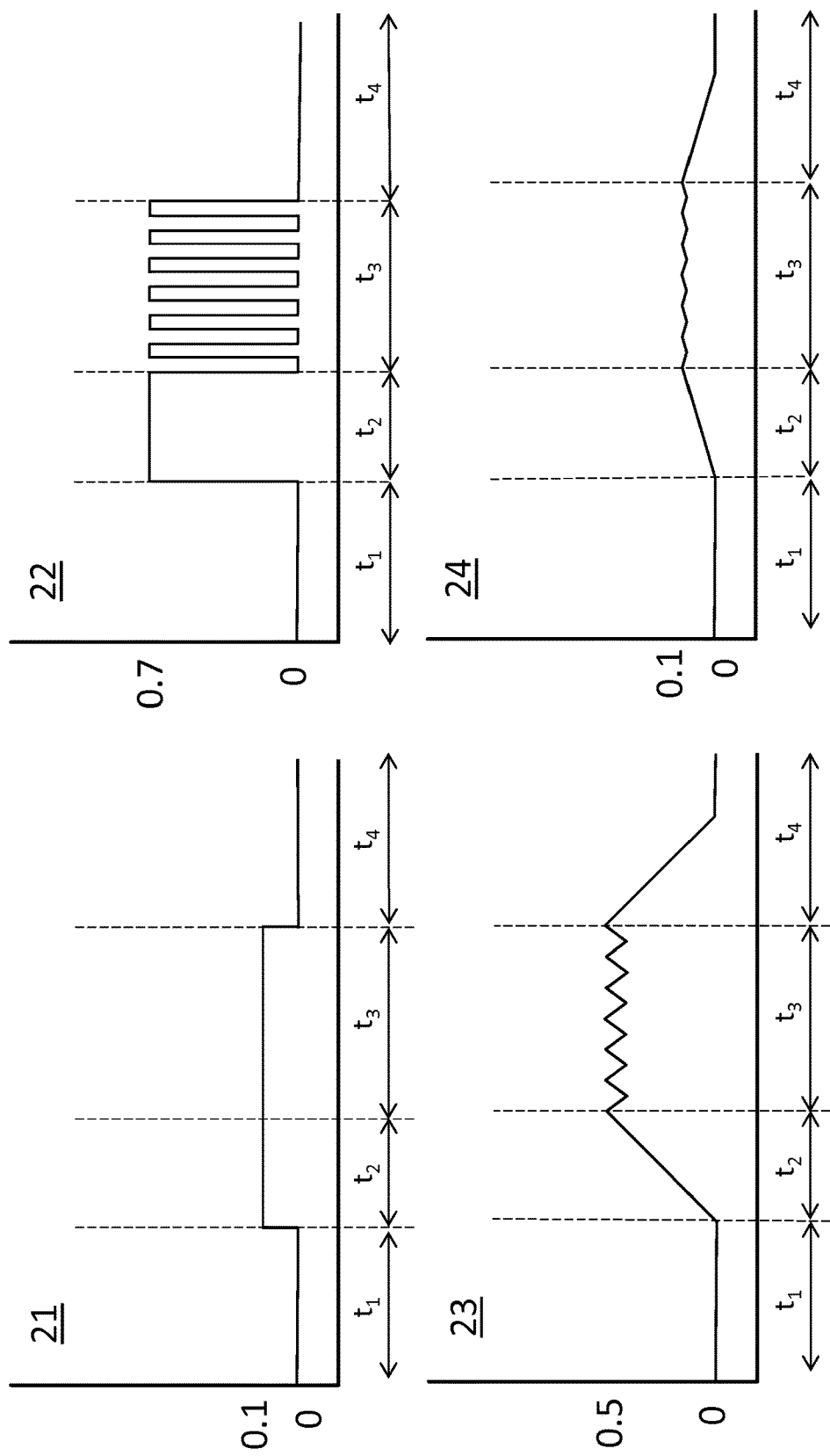
FIG. 2 shows four graphs displaying exemplary voltage signal readouts for an electronic amplifier according to the first embodiment.

With reference to FIG. 2, the operation of the non-inverting embodiment illustrated in FIG. 1 can be more easily understood through a simple example responding to a square input. Graph 21 displays an example input voltage signal ($V_{in1}$) to be amplified, a segment of a square wave, to the electronic amplifier 1 over time. Graph 22 portrays the first two-level comparison voltage signal ($V_{comp1}$) generated by the latched comparator unit 11 unit over time. Graph 23 exhibits the first amplifier output signal ($V_{out1}$) generated by the integrating arrangement over time. Graph 24 shows the first feedback voltage signal ($V_{fb1}$), an attenuation of the first amplifier output signal, generated by the first feedback network over time.

Initially, during a first time period $t_1$, all signals are at a low voltage 0V, with the two-level comparison voltage signal 22 at the second, low level (i.e. 0V), of the two levels available. After this period of time, the voltage to be amplified rises to 0.1V. The comparator unit 112 compares the voltage to be amplified 21 to the feedback voltage signal 24. The voltage signal to be amplified is, throughout a second time period $t_2$, greater than the feedback voltage signal, and so the comparator unit outputs a first level of the two-level comparison voltage signal 22, which may be at the supply voltage to the comparator arrangement (e.g. 0.7V). The integrating arrangement integrates the two-level comparison voltage signal over a set period of time, thereby generating an amplifier output signal 23, which resembles a rising slope. During $t_2$, the feedback voltage signal also rises, due to its dependence on the amplifier output signal. In this example, the amplifier output signal is attenuated to a fifth of the amplifier output signal to attain the feedback voltage signal.

When the feedback voltage signal 24 reaches a level equal to the voltage signal to be amplified 21 (i.e. at the beginning of $t_3$), the voltage signal to be amplified is no longer greater than the feedback voltage signal. The two-level voltage comparison signal 22 thus drops to its initial, low, level. The integrating arrangement continues to integrate with respect to a set period of time, and thus the amplifier output signal drops. Accordingly, the feedback voltage signal also drops in response to this change. As the feedback voltage signal is no longer at an equal level to the voltage signal to be amplified, the two-level comparison signal again generates the first level of the two-level comparison voltage signal. Throughout $t_3$, as the feedback voltage signal periodically drops below the level of the voltage signal to be amplified, this pattern repeats.

As the latched comparator unit 112 only compares the voltage signal to be amplified to the feedback voltage signal at a sampling frequency, $f_s$, high frequency noise proportional to this frequency can be seen in the amplifier output voltage signal.

During $t_4$, when the voltage signal to be amplified drops back to the initial low level voltage 0V, the feedback voltage signal is never less than the voltage signal to be amplified. Thus the two-level comparison voltage signal remains at the second, low level, and thereby the amplifier output signal and the feedback voltage signal gradually reduce to 0V.

In other words, the difference between the input voltage signal 21 ($V_{in1}$) and attenuated amplifier output signal 24 ($V_{fb1}$) is quantized into voltage comparison signal 22 ($V_{comp1}$). In the event the input voltage signal is greater than the attenuated amplifier output signal, the voltage comparison signal 22 is high (0.7V). Otherwise, when the input voltage signal is less than or equal to the attenuated amplifier output signal, the voltage comparison signal 22 is low (0V). If the voltage comparison signal 22 is high, the amplifier output signal 23 rises. Otherwise, if the voltage comparison signal is low, the amplifier output signal 23 lowers. The amplifier output signal is clipped between the voltage supply to the integrating arrangement and by the ground voltage of the integrating arrangement.

Figure 3:
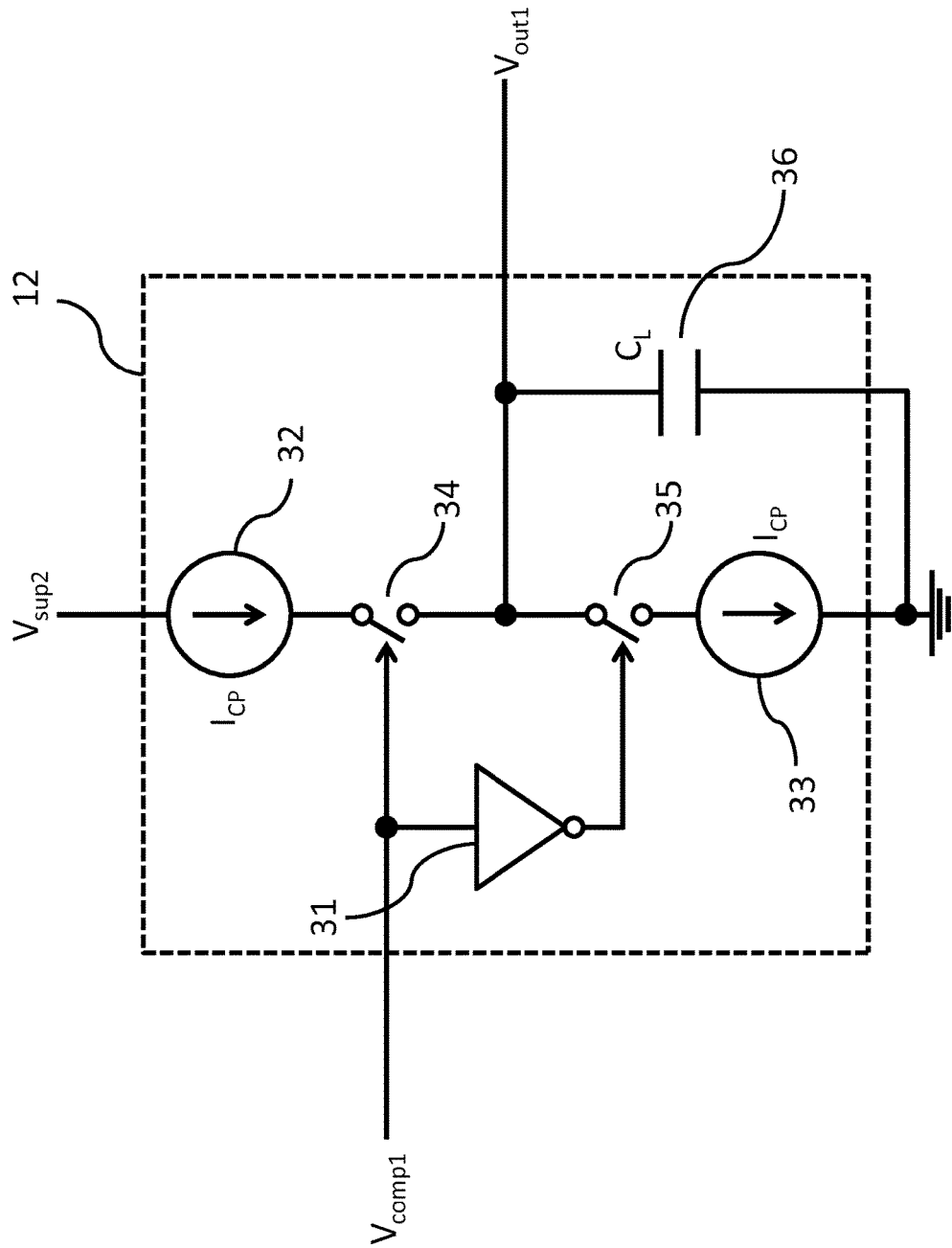
FIG. 3 displays an embodiment of an integrating arrangement for an electronic amplifier according to the first embodiment.

FIG. 3 portrays, an exemplary integrating arrangement 12 according a possible embodiment of FIG. 1. When $V_{comp1}$ is high (e.g. at a second level of the two-level voltage comparison signal), the first switch 34 turns on, and the capacitor 36 is charged by a first current source 32. The voltage at $V_{out1}$ thereby rises, as during $t_2$. The invertor 31 inverts the voltage comparison signal and thus the second switch 35 is in an off state. When $V_{comp1}$ is low (e.g. at the first level of the two-level voltage comparison signal), the first switch 34 is switched off and the second switch 35 is turned on. The charge held at the capacitor 36 is discharged by a second current source 33 and the voltage at $V_{out1}$ decreases accordingly.

Other possible alternatives to the integrating arrangement 12 exist, of which one may comprise an arrangement adapted to accept a first and second voltage comparison signal, wherein the first voltage comparison signal controls the first switch 34 and the second voltage comparison signal controls the second switch 35.

In an optional adaptation to improve the operation of an electronic amplifier according to an embodiment, the output of such integrating stage should not slew. This may be achieved by ensuring that:

$$\frac{I_{CP}}{C_L} > A \cdot f_{sig} \tag{1}$$

where $I_{CP}$ is the current applied by the current source 32 or 34, $C_L$ is the capacitance of the capacitor 36, A is an amplifier gain of the electronic amplifier 1 and $f_{sig}$ is the highest frequency of the first voltage signal to be amplified.

The gain of the exemplary electronic amplifier 1 that uses the integrating arrangement of FIG. 3 may be considered to be dependent upon: the gain applied to the first amplifier output signal (β) by the first feedback network 13; the sampling frequency $f_s$ of the comparator arrangement 11; the time-constant of the integrating arrangement 12 (τ) and the unity-gain bandwidth of the comparator unit 112 ($\omega_u$). Such a gain may be thought to be governed by the equation:

$$\text{gain} = \frac{V_{out1}}{V_{in1}} = \frac{1}{\beta} \cdot \frac{\text{gain}_{OL}}{1 + \text{gain}_{OL}} \tag{2}$$

where the open-loop gain ($\text{gain}_{OL}$) is:

$$\text{gain}_{OL} \sim \frac{1}{\beta} \cdot \left( \frac{\tau f_s^2}{\omega_u} \right) \tag{3}$$

Thus to increase the overall gain of such an amplifier appropriate values for the sampling frequency and the unity gain band-width of the comparator unit may be chosen.

Figure 4:
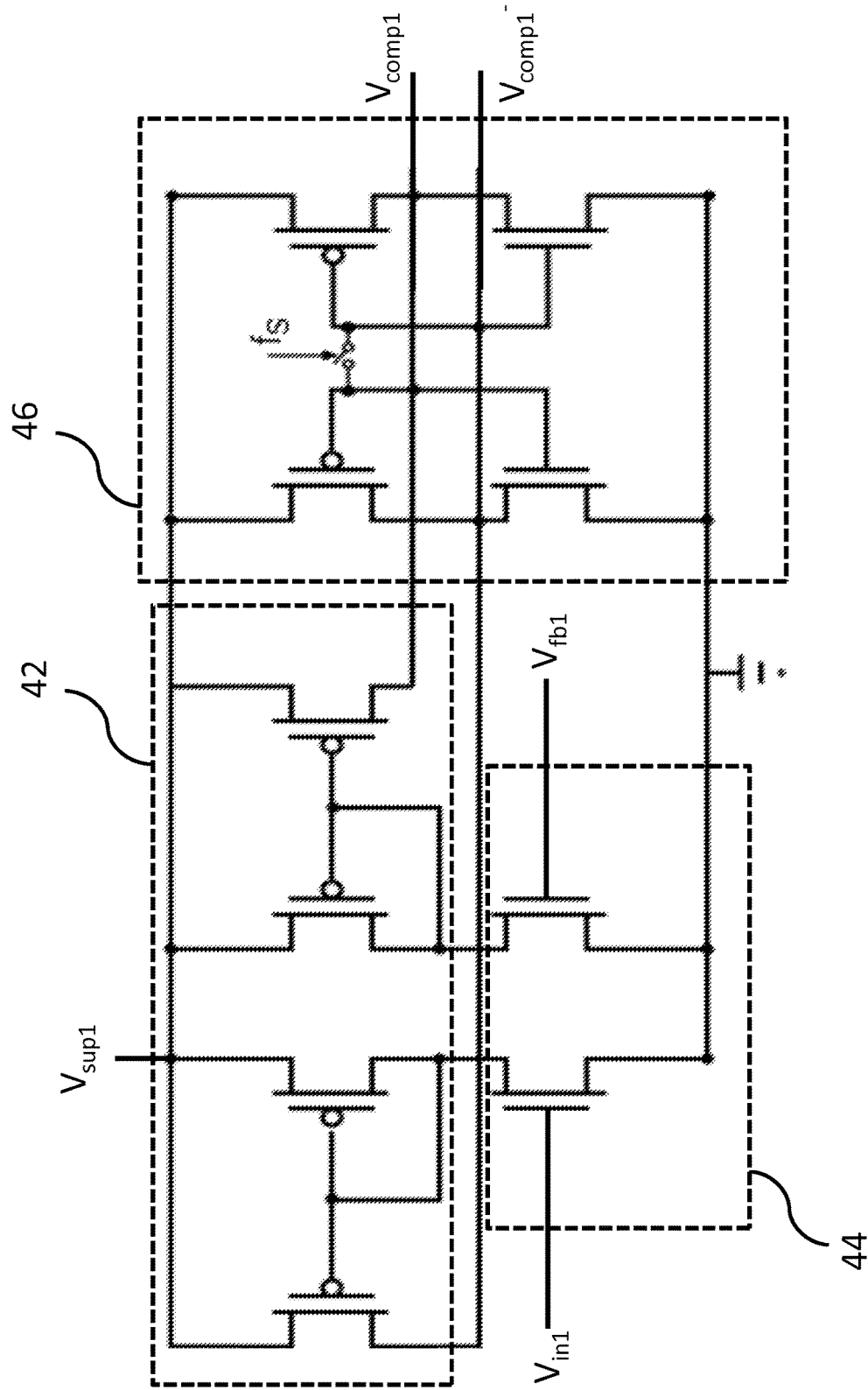
FIG. 4 depicts an embodiment of a comparator unit for an electronic amplifier according to the first embodiment.

Turning to FIG. 4, an exemplary comparator unit for an embodiment according to FIG. 1 is shown. The pair of input transistors 44 converts the two input signals ($V_{in1}$ and $V_{fb1}$) into a current. This current is mirrored by the pair of current mirrors 42. Both mirrored currents are fed to the latch 46, which hold the comparison values. $V_{comp1}$ outputs the two-level comparison voltage signal. $V_{comp1}^-$ outputs the inverse of the two-level comparison voltage signal, an optional feature.

In an optional adaptation, the first voltage comparison signal ($V_{comp1}$) controls the first switch 34 of the integrating arrangement 12, and the inverse of the first voltage comparison signal ($V_{comp1}^-$) controls the second switch 35 of the integrating arrangement 12.

Figure 5:
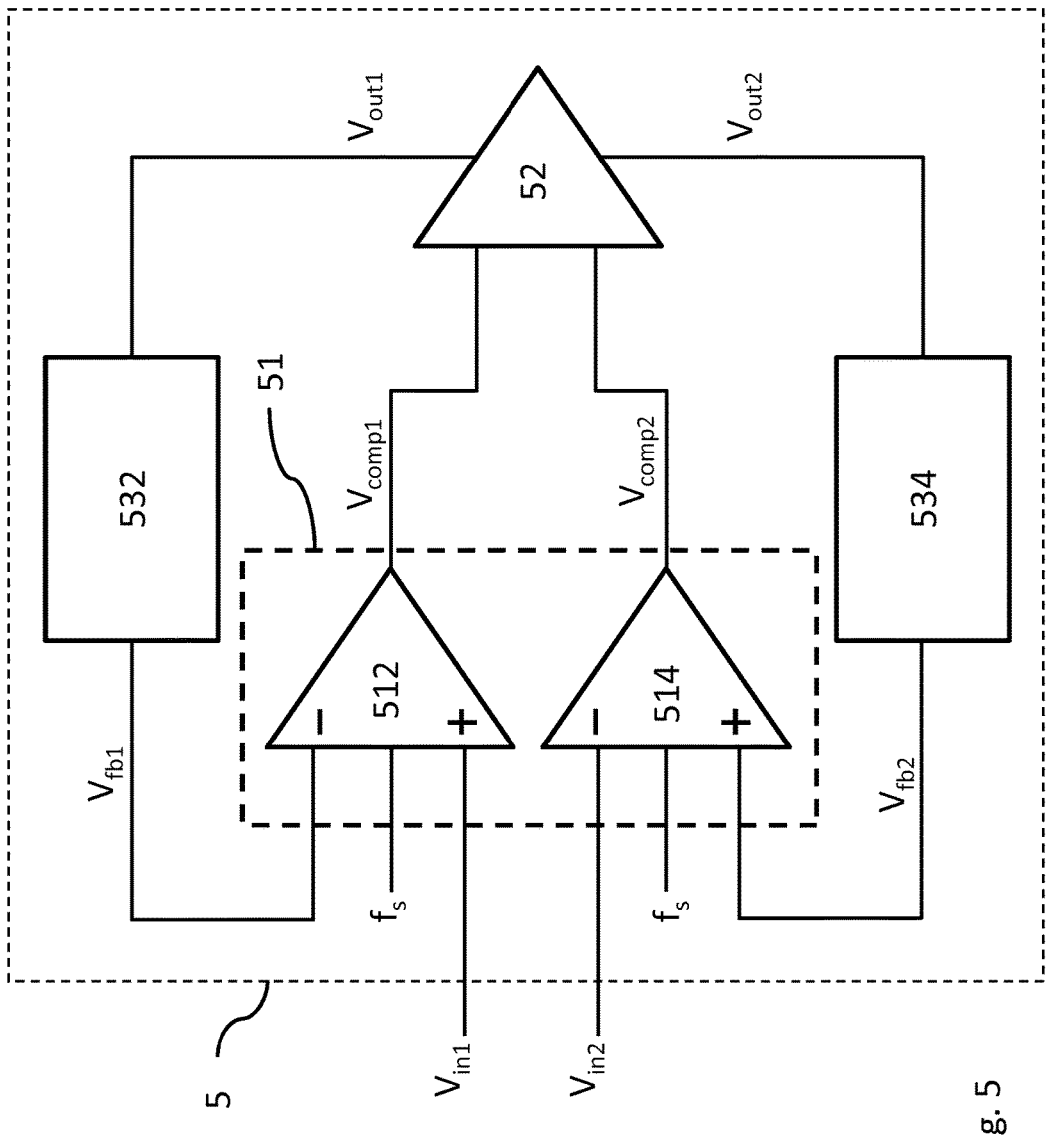
FIG. 5 illustrates an electronic amplifier according to a second embodiment.

In FIG. 5 another embodiment of an electronic amplifier 5 for amplifying a complimentary pair of a first ($V_{in1}$) and second ($V_{in2}$) voltage signal to be amplified is shown. The electronic amplifier 5 corresponds to a non-inverting embodiment. The comparator arrangement 51, having a first supply voltage (not shown), receives both the first and second voltage signal to be amplified. A first comparator unit 512 compares the first voltage signal to be amplified to a first feedback voltage signal ($V_{fb1}$), thereby generating a first two-level voltage comparison signal ($V_{comp1}$). A second comparator unit 514 compares the second voltage signal to be amplified to a second feedback voltage signal ($V_{fb2}$), thereby generating a second two-level voltage comparison signal ($V_{comp2}$). The integrating arrangement 52 receives both the first and second two-level voltage comparison signal to perform an integration operation. The integrating arrangement 52 generates a first and second amplifier output voltage signals ($V_{out1}$ and $V_{out2}$). The difference between the first and second amplifier output voltage signal corresponds to an amplification of the difference between the first and second voltage signals to be amplified in the complimentary pair. This may be understood as observing that:

$$V_{out1} - V_{out2} = A(V_{in1} - V_{in2}) \tag{4}$$

where A is an amplifier gain of the electronic amplifier 5.

Both amplifier output voltage signals are received by a respective first 532 and second 534 feedback network. Each feedback network applies a gain to their respective amplifier output voltage signal to generate the first and second feedback voltage signal.

Optionally, the magnitude of the gain applied to the first and second feedback voltage signal is the same value.

In another possible embodiment, the electronic amplifier 5 is further adapted to comprise a complimentary pair of chopper switches, the first spanning the first and second voltage signal to be amplified, the second spanning the first and second amplifier output voltage signals. The chopper switch helps to mitigate the effect of pink or flicker noise.

There may be high frequency noise spurs in either or both of the amplifier output voltage signals, caused by, for example, quantization noise. This noise may be filtered out using at least one low-pass filter.

Figure 6:
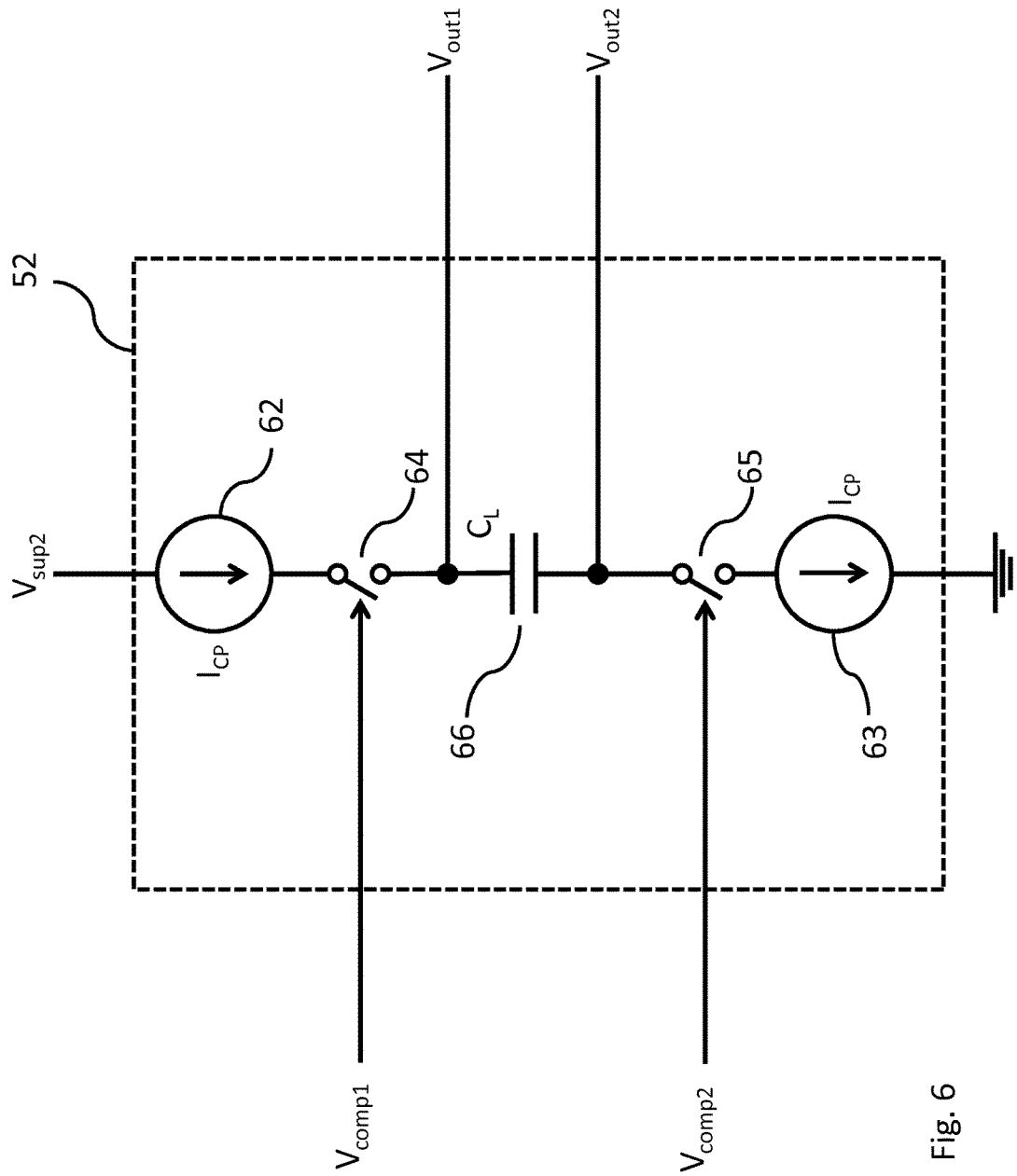
FIG. 6 displays an embodiment of an integrating arrangement for an electronic amplifier according to the second embodiment.

FIG. 6 portrays an exemplary integrating arrangement 52 according a possible embodiment of FIG. 5. Both comparison voltage signals $V_{comp1}$ and $V_{comp2}$ are received by the integrating arrangement 52 and applied to a first 64 and second 65 switch respectively. When $V_{comp1}$ is high, the current source 62 charges the capacitor 66. When $V_{comp2}$ is low, the current source 63 applies a negative charge on the capacitor 66, increasing the rate of discharge. $V_{out1}$ and $V_{out2}$ are thus generated relative to the amount of charge at each terminal of the capacitor.

In the example above, the supply voltage for the comparator and for the integrator are given as 0.7V. The supply voltage may be lower, for example in the range 0.2V to 0.6V, for example 0.3V or 0.4V. The amplifier is for example of interest for amplifying low voltage signals, for example in the range 1 mV to 100 mV, with a typical gain in the range 10 to 100. The sampling frequency fs may for example be in the range 1 MHz to 15 MHz, for example 5 MHz to 10 MHz.

The circuit arrangement described above enables a low voltage implementation by using a low voltage comparator (such as shown in FIG. 4) and a low voltage integrator. As a conventional amplifier design at low voltages suffers from limited voltage headroom, there is a three way trade-off between gain, voltage swing and power consumption. A high gain is important to improve accuracy. Thus, a typical amplifier design has either reduced voltage swing or increased power consumption. A comparator as embodied herein, may not suffer from limited voltage headroom because the information is converted into the time domain. The gain of such a comparator depends on both its reset frequency and its unity-gain bandwidth, neither of which depend on the voltage supply to a first order. However, a low voltage supply to a comparator unit may limit the maximum reset frequency ($f_s$) available. Thus, it may be preferable to limit the reset frequency ($f_s$) to be less than 15 MHz, and particularly less than 10 MHz for a voltage supply <0.7V. $F_s$<10 MHz is acceptable for a variety of applications, including amplification of a sensor readout.

The invention is for example of particular interest for low voltage instrumentation amplifiers as the electronic amplifier may be considered to be an instrumentation amplifier due in part to the high input impedance of the at least one comparator unit of the comparator arrangement. In one optional alternative, however, the electronic amplifier described herein may be used to replace each operational amplifier in a standard instrumentation amplifier configuration with three operational amplifiers.

Figure 7:
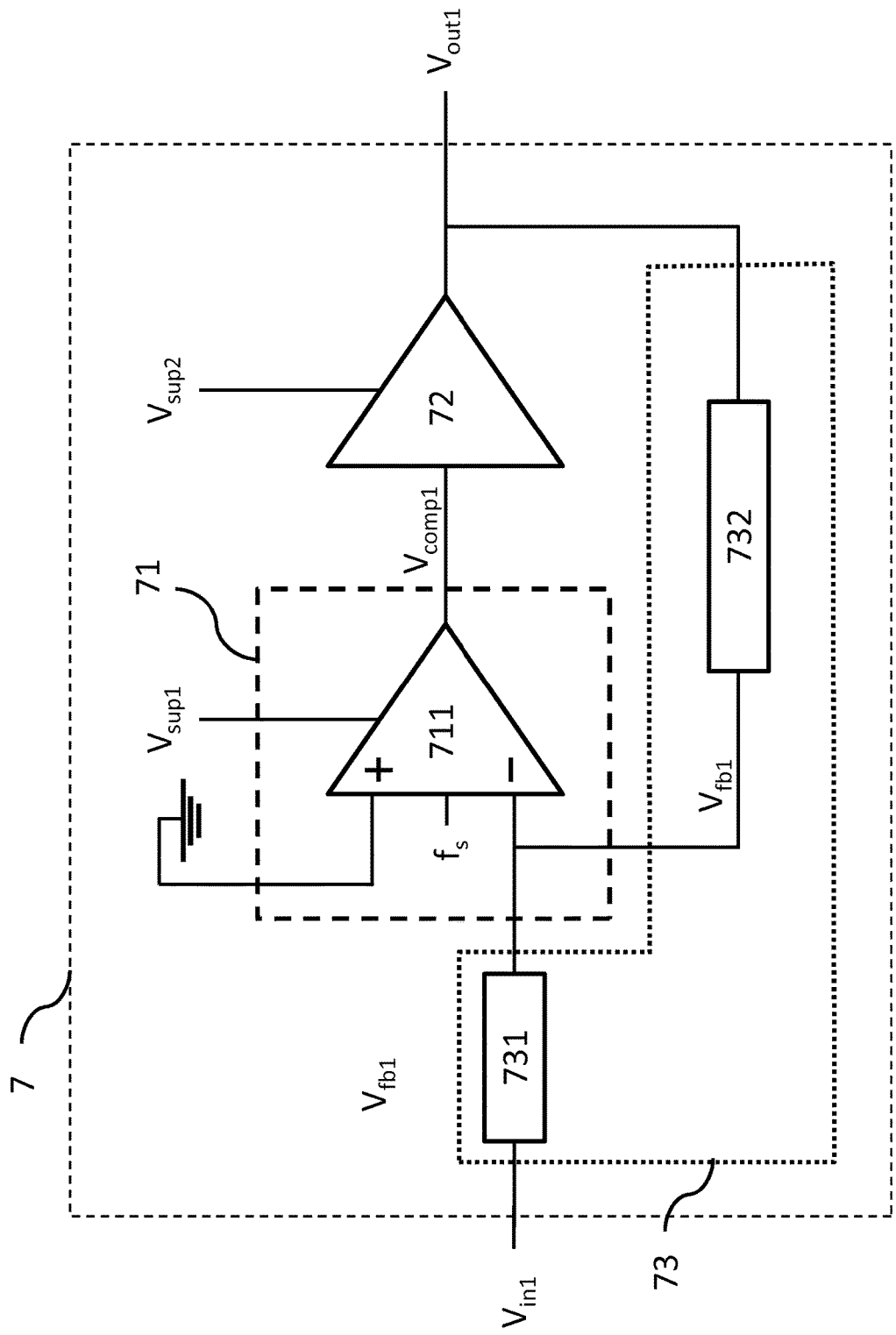
FIG. 7 illustrates an electronic amplifier according to a third embodiment.

Another embodiment for amplification of a first voltage signal to be amplified is illustrated in FIG. 7. This embodiment is a negative feedback or inverting configuration of the electronic amplifier. The first voltage signal $V_{in1}$ and a first feedback signal $V_{fb1}$ are provided to the comparator arrangement 71. The comparator unit 711 of the comparator arrangement 71 generates a first two-level voltage comparison signal corresponding to whether the difference between the first voltage signal and the first feedback signal is positive or negative (i.e. $V_{in1}$–$V_{fb1}$). The two-level voltage comparison signal is provided to the integrating arrangement 72, which may be as embodied, for example, in FIG. 2. The integrating arrangement integrates the two-level voltage comparison signal to generate a first amplifier output signal.

The first amplifier output signal is provided to the first feedback network 73, which comprises a voltage divider having a first 731 and second 732 resistor. In an embodiment, this feedback network applies fractional gain to the first amplifier output signal such that the feedback signal supplied to the comparator arrangement 71 is an attenuation of the first amplifier output signal.

Figure 8:
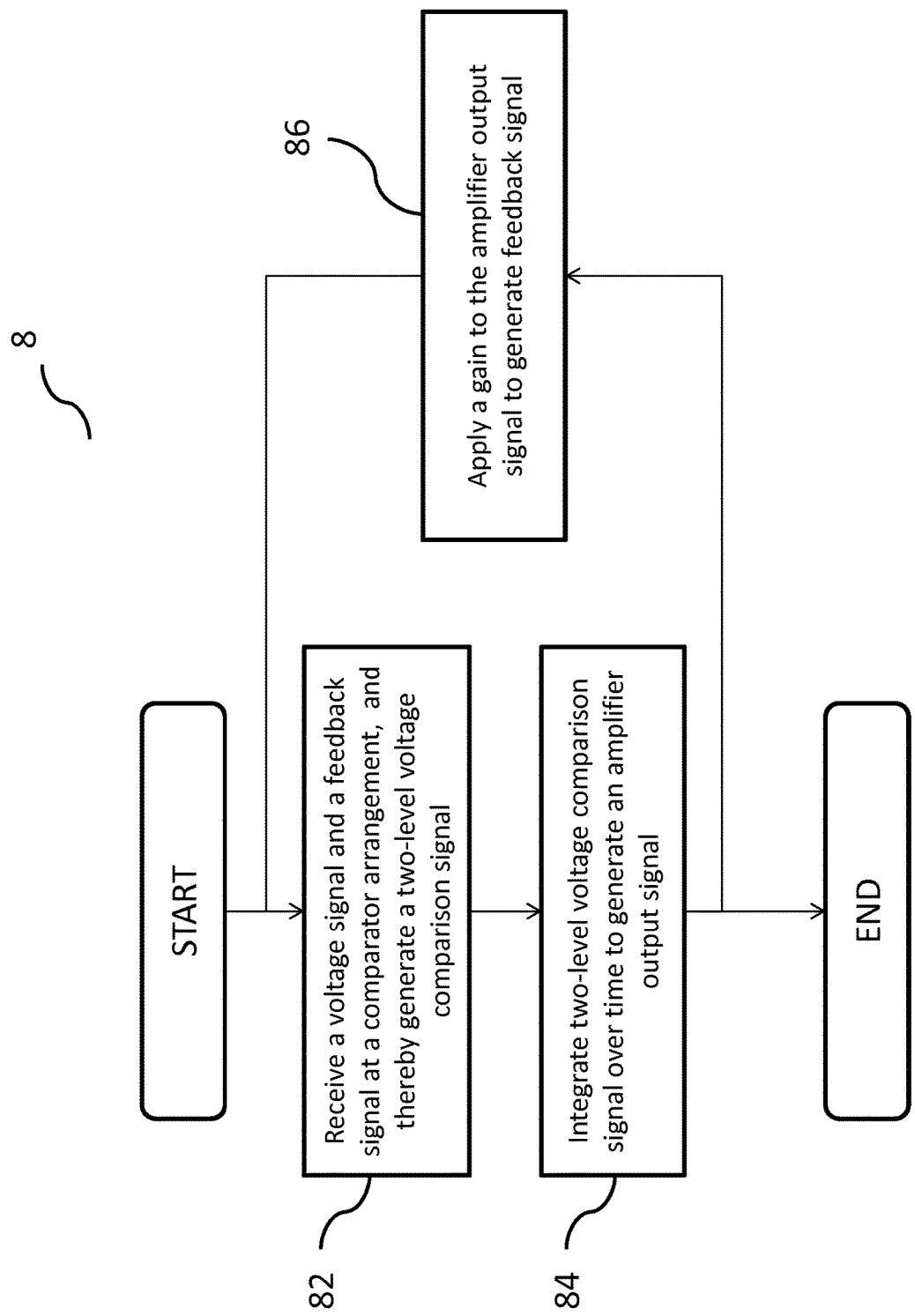
FIG. 8 is a flowchart illustrating a method of amplifying a first voltage signal to be amplified according to an embodiment.

A method of amplifying a voltage signal can be described with regard to FIG. 8, wherein a voltage signal is first compared 82 to a feedback signal to generate a two-level voltage comparison signal. This two-level voltage comparison signal is integrated over time 84 to generate an amplifier output signal. To generate the feedback signal for comparison with the voltage signal, a gain is applied 86 to the amplifier output signal.

Other embodiments will be apparent to those skilled in the art.

What is claimed is:

1. An electronic amplifier for amplification of a first voltage signal to be amplified, the electronic amplifier comprising:
   a comparator arrangement having a first voltage supply level of 0.7V or less and comprising a latched comparator unit having a sampling frequency, wherein said comparator arrangement is adapted to receive the first voltage signal to be amplified and a first feedback voltage signal, and to generate a first two-level voltage comparison signal;
   an integrating arrangement having a second voltage supply level of 0.7V or less, wherein said integrating arrangement is adapted to receive the first two-level voltage comparison signal, and to generate a first amplifier output signal corresponding to an amplification of the first voltage signal to be amplified; and
   a first feedback network adapted to receive the first amplifier output signal and to apply a feedback gain factor to the first amplifier output signal to generate the first feedback voltage signal.

2. The electronic amplifier of claim 1, wherein the comparator unit of the comparator arrangement comprises MOSFETs configured to output the first two-level voltage comparison signal and the inverse of the same.

3. The electronic amplifier of claim 1, wherein the integrating arrangement is a charge-pump integrator.

4. The electronic amplifier of claim 1, wherein the sampling frequency of the latched comparator unit is no less than two orders of magnitude greater than the highest frequency of the first voltage signal to be amplified.

5. The electronic amplifier of claim 1, wherein at least one low-pass filter is applied to the first amplifier output signal.

6. The electronic amplifier of claim 1, wherein the comparator arrangement is further adapted to generate a second two-level voltage comparison signal, wherein the second two-level voltage comparison signal is an inversion of the first two-level voltage comparison signal, and wherein the integrating arrangement is further adapted to receive the second two-level voltage comparison signal.

7. The electronic amplifier of claim 1 for amplifying a complimentary pair of a first and second voltage signal, wherein the comparator arrangement comprises at least one latched comparator unit having the same sampling frequency, wherein the comparator arrangement is further adapted to receive the second voltage signal to be amplified and a second feedback voltage signal, and to generate a second two-level voltage comparison signal, wherein the integrating arrangement is further adapted to receive the second two-level voltage comparison signal and to generate a second amplifier output signal corresponding to an amplification of the second voltage signal to be amplified, such that the difference between the first and second amplifier output signals corresponds to an amplification of the difference between the first and second voltage signals to be amplified, and wherein the electronic amplifier further comprises:
   a second feedback network adapted to receive the second amplifier output signal and to generate the second feedback voltage signal.

8. The electronic amplifier of claim 7, wherein the first and second voltage signals are a complimentary pair of differential signals.

9. The electronic amplifier of claim 7, further comprising a complimentary pair of chopper circuits, wherein the first chopper circuit spans the complimentary pair of a first and second voltage signal and the second chopper circuit spans the first and second amplifier output signals.

10. The electronic amplifier of claim 7, further comprising at least one low pass filter applied to at least one of the first and second amplifier output signals.

11. The electronic amplifier of claim 7, wherein the comparator arrangement further comprises at least one pre-amplification stage applied to at least one of the first feedback signal, the first voltage signal to be amplified, the second feedback signal, and the second voltage to be amplified.

12. The electronic amplifier of claim 7, further comprising an instrumentation amplifier.

13. A method of amplifying a voltage signal to be amplified, the method comprising:
    receiving the voltage signal to be amplified and a first feedback voltage at a comparator arrangement and generating a first two-level voltage comparison signal;
    integrating the first two-level voltage comparison signal over time to generate a first amplifier output signal, corresponding to an amplification of the voltage signal to be amplified; and
    applying a feedback gain factor to the first amplifier output signal to generate the first feedback voltage signal, wherein the maximum voltage level of any voltage signal is 0.7V.

14. The method of claim 13, wherein:
    the step of receiving the voltage signal to be amplified further comprises receiving a second voltage signal to be amplified and a second feedback voltage at the comparator arrangement to generate a second two-level voltage comparison signal;
    the step of integrating the first two-level voltage comparison signal over time further comprises integrating the second two-level voltage comparison signal, such that the integration operation corresponds to the difference between the first and second two-level voltage comparison signals;
    the step of integration further comprises generating a second amplifier output voltage signal, such that the difference between the first and second amplifier output voltage signal corresponds to an amplification of the difference between the first and second voltage signals to be amplified; and
    the step of applying a feedback gain factor further comprises applying a feedback gain factor to the second amplifier output signal to generate the second feedback voltage.

15. The method of claim 14, wherein the feedback gain factor applied to the first and second amplifier output signal is the same.

16. An electronic amplifier configured to amplify a voltage signal, the electronic amplifier comprising:
    means for receiving the voltage signal and a first feedback voltage, the receiving means configured to generate a first two-level voltage comparison signal;
    means for integrating the first two-level voltage comparison signal over time to generate a first amplifier output signal, corresponding to an amplification of the voltage signal to be amplified; and
    means for applying a feedback gain factor to the first amplifier output signal to generate the first feedback voltage signal, wherein the maximum voltage level of any voltage signal is 0.7V.

17. The electronic amplifier of claim 16, wherein the receiving means comprises a latched comparator unit.

18. The electronic amplifier of claim 16, wherein the integrating means comprises a charge-pump integrator.

19. The electronic amplifier of claim 16, wherein the applying means comprises a first feedback network.

20. An electronic amplifier for amplification of a first voltage signal to be amplified, the electronic amplifier comprising:
    a comparator arrangement having a first voltage supply level of 0.7V or less and comprising a latched comparator unit having a sampling frequency, wherein said comparator arrangement is adapted to receive the first voltage signal to be amplified and a first feedback voltage signal, and to generate a first two-level voltage comparison signal;
    an integrating arrangement having a second voltage supply level of 0.7V or less, wherein said integrating arrangement is adapted to receive the first two-level voltage comparison signal, and to generate a first amplifier output signal which is proportional to the first two-level voltage comparison signal integrated over time and corresponds to an amplification of the first voltage signal to be amplified; and
    a first feedback network adapted to receive the first amplifier output signal and to generate the first feedback voltage signal.

* * * * *